United States Patent
Zhu et al.

(10) Patent No.: US 10,389,337 B2
(45) Date of Patent: Aug. 20, 2019

(54) RAMP GENERATOR FOR WIDE FREQUENCY RANGE PULSE WIDTH MODULATOR CONTROLLER OR THE LIKE

(71) Applicant: FAIRCHILD SEMICONDUCTOR CORPORATION, Sunnyvale, CA (US)

(72) Inventors: Hua Zhu, Austin, TX (US); Kaiwei Yao, San Jose, CA (US)

(73) Assignee: FAIRCHILD SEMICONDUCTOR CORPORATION, Phoenix, AZ (US)

(*) Notice: Subject to any disclaimer, the term of this patent is extended or adjusted under 35 U.S.C. 154(b) by 59 days.

(21) Appl. No.: 15/584,729

(22) Filed: May 2, 2017

(65) Prior Publication Data

US 2017/0338807 A1    Nov. 23, 2017

Related U.S. Application Data

(60) Provisional application No. 62/340,155, filed on May 23, 2016.

(51) Int. Cl.
*H03K 4/50* (2006.01)
*H03K 5/003* (2006.01)

(52) U.S. Cl.
CPC .............. *H03K 5/003* (2013.01); *H03K 4/50* (2013.01)

(58) Field of Classification Search
CPC .................. H03K 5/003; H03K 4/06
See application file for complete search history.

(56) References Cited

U.S. PATENT DOCUMENTS 6,271,735 B1 *  8/2001  Halamik .............. H03K 3/0231
                                                            331/111

* cited by examiner

*Primary Examiner* — Hai L Nguyen
(74) *Attorney, Agent, or Firm* — Polansky & Associates, P.L.L.C.; Paul J. Polansky

(57) ABSTRACT

A ramp generator includes a current generator, a current mirror, and a first capacitor. The current generator has an input for receiving a clock signal, and an output for providing a current proportional to a frequency of the clock signal using a first transistor having first and second current electrodes and a control electrode, an amplifier that establishes a reference voltage on the second current electrode of the first transistor, and a variable resistor coupled between the second current electrode of the second transistor and ground whose resistance is set according to the frequency of the clock signal. The current mirror has an input coupled to the first terminal of the first transistor, and a second terminal. The first capacitor has a first terminal coupled to the output of the current mirror and providing a ramp signal, and a second terminal coupled to the first power supply voltage terminal.

15 Claims, 4 Drawing Sheets

RAMP GENERATOR FOR WIDE FREQUENCY RANGE PULSE WIDTH MODULATOR CONTROLLER OR THE LIKE

BACKGROUND

1. Field of the Disclosure

The present disclosure relates generally to electrical circuits, and more particularly but not exclusively to ramp generators.

2. Description of the Background Art

A power supply may include a control transistor that is modulated to maintain a regulated output voltage. The switching operation of the control transistor may be controlled by pulse width modulation (PWM) using a PWM controller integrated circuit (IC) chip. The PWM controller IC chip receives a feedback signal indicative of the output voltage and modulates the control transistor by PWM in accordance with the feedback signal.

More particularly, the PWM controller IC includes an error amplifier that compares the feedback signal to a reference signal to generate an error signal. In a voltage-mode PWM controller IC chip, the error signal is compared to a ramp signal to control the ON/OFF time of the control transistor. As can be appreciated, the stability of the ramp signal is critical in maintaining a regulated output voltage, especially in applications where the PWM controller IC is expected to operate over a wide frequency range.

BRIEF DESCRIPTION OF THE DRAWINGS

The present disclosure may be better understood, and its numerous features and advantages made apparent to those skilled in the art by referencing the accompanying drawings, in which.

The use of the same reference symbols in different drawings indicates similar or like components. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION

In the present disclosure, numerous specific details are provided, such as examples of circuits, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
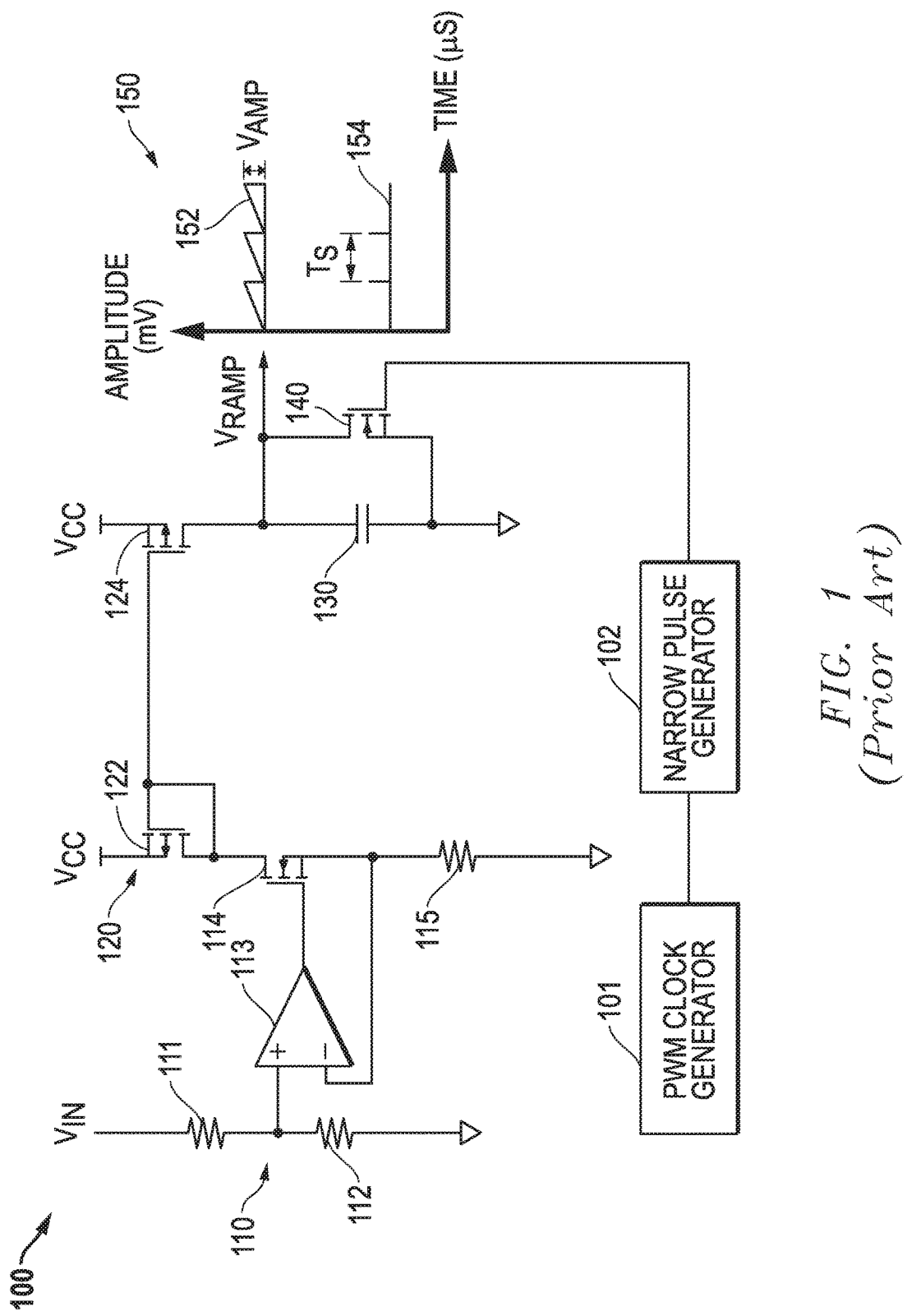
FIG. 1 shows a partial block, partial schematic, and partial timing diagram of a ramp generator known in the prior art.

FIG. 1 shows a partial block, partial schematic, and partial timing diagram of a ramp generator 100 known in the prior art. Ramp generator 100 includes generally a PWM clock generator 101, a narrow pulse generator 102, a current generator 110, a current mirror 120, a ramp capacitor 130, and an N-channel transistor 140. PWM clock generator 101 has an output for providing a PWM clock signal that is used, for example, in a voltage mode PWM circuit (not shown in FIG. 1). Narrow pulse generator 102 has an input connected to the output of PWM clock generator 101, and an output.

Current generator 110 includes resistors 111 and 112, an amplifier 113, an N-channel metal-oxide-semiconductor (MOS) transistor 114, and a resistor 115. Resistor 111 has a first terminal for receiving an input voltage labeled "$V_{IN}$", and a second terminal. Resistor 112 has a first terminal connected to the second terminal of resistor 111, and a second terminal connected to ground. Amplifier 113 has a non-inverting input connected to the second terminal of resistor 111, an inverting input, and an output. Transistor 114 has a drain, a gate connected to the output of amplifier 113, and a source connected to the inverting input of amplifier 113. Resistor 115 has a first terminal connected to the source of transistor 114, and a second terminal connected to ground.

Current mirror 120 includes P-channel MOS transistors 122 and 124. Transistor 122 has a source connected to a power supply voltage terminal labeled "$V_{CC}$", a gate, and a drain connected to the gate thereof and forming an input of current mirror 120. $V_{CC}$ is a positive power supply voltage terminal that is generated from input voltage $V_{IN}$ using an internal voltage regulator, not shown in FIG. 1. Transistor 124 has a source connected to $V_{CC}$, a gate connected to the drain of transistor 122, and a drain forming an output of current mirror 120 and providing a signal labeled "$V_{RAMP}$".

Ramp capacitor 130 has a first terminal connected to the drain of transistor 124, and a second terminal connected to ground. Transistor 140 has a drain connected to the source of transistor 124, a gate connected to the output of narrow pulse generator 102, and a source connected to ground.

FIG. 1 also shows a timing diagram 150 of signals useful in understanding ramp generator 100. In FIG. 1, the horizontal axis represents time in microseconds (μs), and the vertical axis represents the amplitude of respective signals in millivolts (mV). Timing diagram 150 includes a first waveform 152 corresponding to signal $V_{RAMP}$, and a second waveform 154 showing the output of narrow pulse generator 102 that is provided to the gate of transistor 140.

Ramp generator 100 includes current generator 110 to generate a current designated "$I_{R3}$" through resistor 115 whose magnitude is given by:

$$I_{R3} = \frac{VIN * R2}{(R1 + R2) * R3} \quad \text{(EQ. 1)}$$

in which R1 is the resistance of resistor 111, R2 is the resistance of resistor 112, and R3 is the resistance of resistor 115.

Transistors 122 and 124 form a current mirror 120 that mirrors current IR3 to generate a mirrored current that charges ramp capacitor 130. If current mirror 120 has a gain of one, then the peak voltage $V_{AMP}$ of the ramp signal $V_{RAMP}$ is thus given by $$V_{AMP} = \frac{VIN * T_S * R2}{(R1 + R2) * (R3 * CRAMP)} \quad \text{(EQ. 2)}$$

in which $V_{AMP}$ is the peak voltage of the ramp signal $V_{RAMP}$, and $T_S$ is the period of the PWM clock signal from PWM clock generator 101. The narrow pulse signal from narrow pulse generator 102 has the same period as the PWM clock signal but with a narrow pulse width, such as 50 nanoseconds (ns). Transistor 140 is turned ON and OFF by the narrow pulse signal to reset the voltage on ramp capacitor 130 to develop the ramp signal $V_{RAMP}$.

Generally speaking, the peak voltage $V_{AMP}$ must be less than the bias voltage $V_{CC}$ of the PWM controller IC so that there is enough headroom to ensure proper operation of the transistors 122 and 124. On the other hand, a large peak voltage $V_{AMP}$ is good for the control loop with less noise sensitivity. However from EQ. 2, the peak voltage $V_{AMP}$ is proportional to the switching period $T_S$. Also, the resistance of resistor 115 and the capacitance of ramp capacitor 130 can vary significantly, making ramp generator 100 suitable only for fixed frequency or very narrow frequency range applications.

Figure 2:
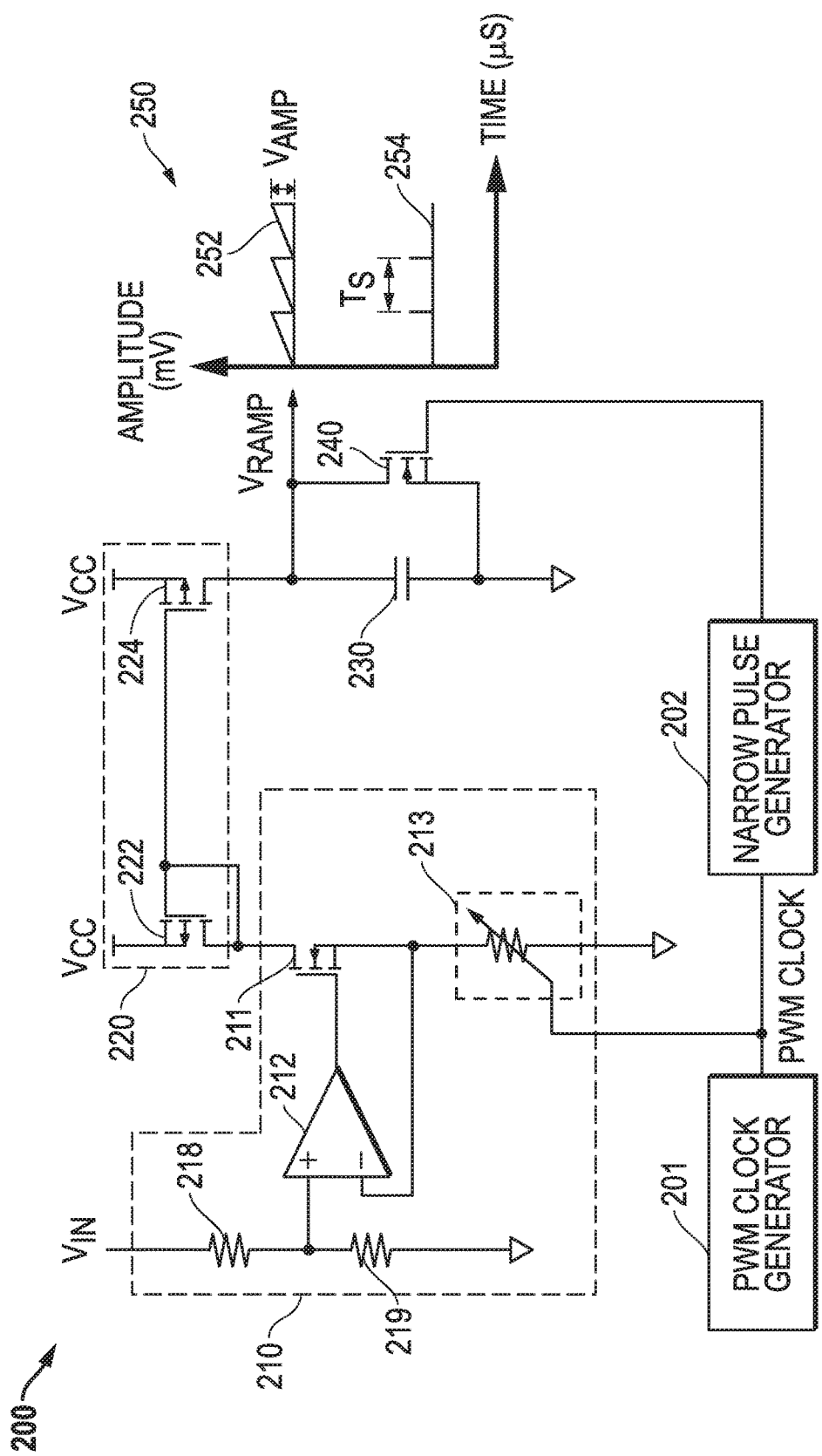
FIG. 2 shows a partial block, partial schematic, and partial timing diagram of a ramp generator in accordance with an embodiment of the present invention.

FIG. 2 shows a partial block, partial schematic, and partial timing diagram of a ramp generator 200 in accordance with an embodiment of the present invention. Ramp generator 200 includes generally a PWM clock generator 201, a narrow pulse generator 202, a current generator 210, a current mirror 220, a ramp capacitor 230, and an N-channel MOS transistor 240. PWM clock generator 201 has an output for providing a clock signal labeled "PWM CLOCK" that is used, for example, in a voltage mode PWM circuit (not shown in FIG. 2). Narrow pulse generator 202 has an input connected to the output of PWM clock generator 201, and an output.

Current generator 210 includes an N-channel MOS transistor 211, an amplifier 212, a variable resistor 213, and resistors 218 and 219. Transistor 211 has a drain, a gate, and a source. Amplifier 212 has a non-inverting input, an inverting input connected to the source of transistor 211, and an output connected to the gate of transistor 211. Variable resistor 213 has a first terminal connected to the source of transistor 211, a second terminal connected to ground, and a control terminal connected to the output of PWM clock generator 201. Resistor 218 has a first terminal for receiving input voltage $V_{IN}$, and a second terminal connected to the non-inverting input of amplifier 212. Resistor 219 has a first terminal connected to a second terminal of resistor 218, and a second terminal connected to ground.

Current mirror 220 includes P-channel MOS transistors 222 and 224. Transistor 222 has a source connected to $V_{CC}$, a gate, and a drain connected to the gate thereof and forming an input of current mirror 220. Transistor 224 has a source connected to $V_{CC}$, a gate connected to the drain of transistor 222, and a drain forming an output of current mirror 220 and providing signal $V_{RAMP}$.

Ramp capacitor 230 has a first terminal connected to the drain of transistor 224, and a second terminal connected to ground. Transistor 240 has a drain connected to the source of transistor 224, a gate connected to the output of narrow pulse generator 202, and a source connected to ground.

FIG. 2 also shows a timing diagram 250 of signals useful in understanding ramp generator 100. In FIG. 2, the horizontal axis represents time in µs, and the vertical axis represents the amplitude of respective signals in mV. Timing diagram 250 includes a first waveform 252 corresponding to signal $V_{RAMP}$, and a second waveform 254 showing the output of narrow pulse generator 202 that is provided to the gate of transistor 240.

Ramp generator 200 is similar to the ramp generator 100, but with a variable resistor 213 instead of the fixed resistor 115. In the illustrated embodiment, the resistance of variable resistor 213 tracks the frequency of the PWM CLOCK signal generated by PWM clock generator 201. In one embodiment, the resistance of the variable resistor 213 is given by:

$$R_{213} = \frac{K0}{fs} \quad \text{(EQ. 3)}$$

in which $K_0$ is a constant value, and fs is the frequency of the PWM CLOCK generated by PWM clock generator 201. Thus as the switching frequency rises, such as by a programmable amount set by a resistor external to the chip, by a setting of one or more fuses, or the like, the resistance of variable resistor 213 varies inversely, and the current generated by current generator 210 varies proportionally.

Figure 3:
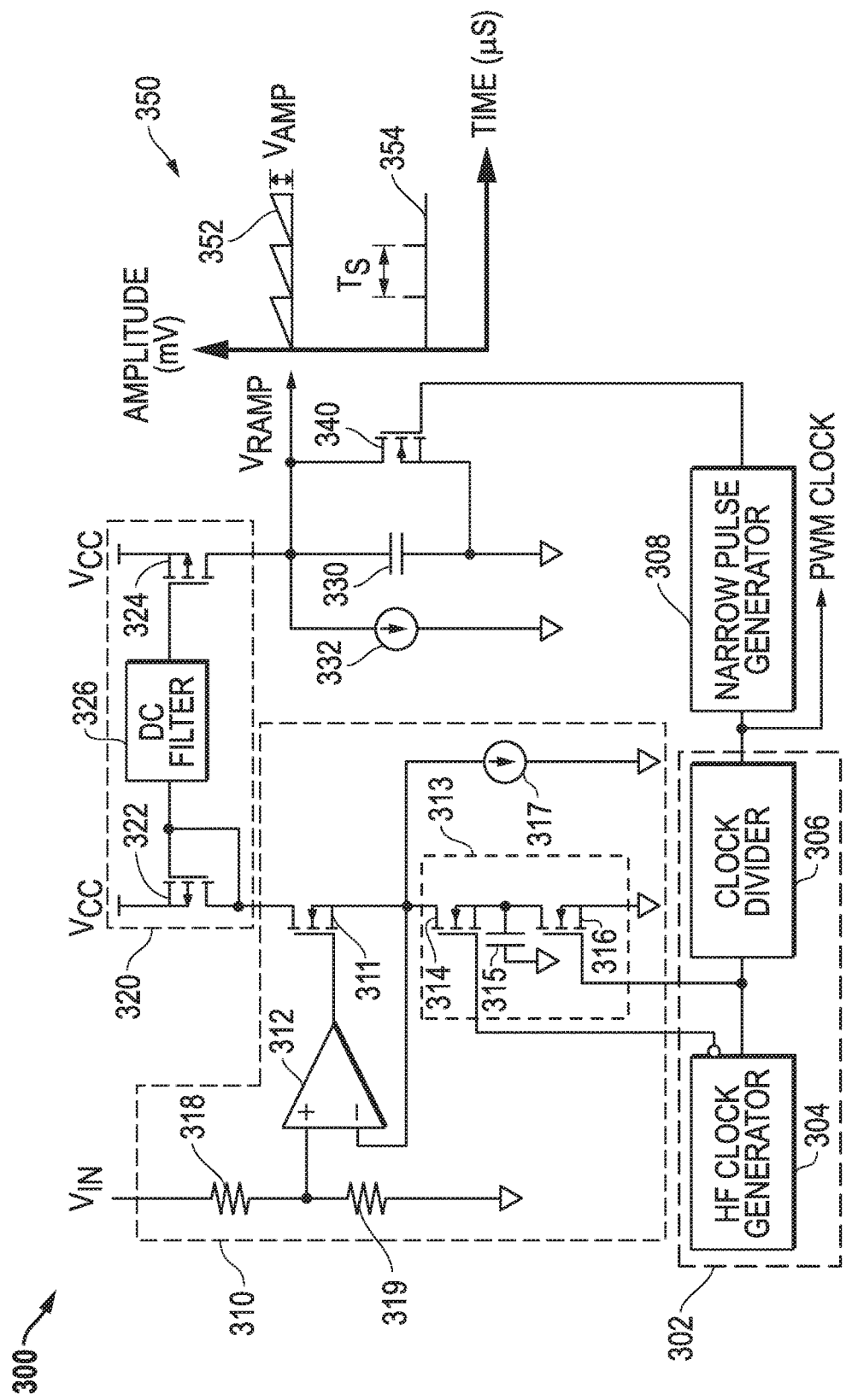
FIG. 3 shows a partial block, partial schematic, and partial timing diagram in accordance with another embodiment of the present invention.

FIG. 3 shows a partial block, partial schematic, and partial timing diagram of a ramp generator 300 in accordance with another embodiment of the present invention. Ramp generator 300 includes generally a PWM clock generator 302, a narrow pulse generator 308, a current generator 310, a current mirror 320, a ramp capacitor 330, a current source 332, and an N-channel transistor 340. PWM clock generator 302 includes a high frequency (HF) clock generator 304 and a clock divider 306. HF clock generator 304 has a first output for providing a clock signal, and a second output for providing a complement of the clock signal. Clock divider 306 has an input connected to the first output of HF clock generator 304, and an output for providing the PWM CLOCK signal that is used, for example, in a voltage mode PWM circuit (not shown in FIG. 2). Narrow pulse generator 308 has an input connected to the output of clock divider 306, and an output.

Current generator 310 includes an N-channel MOS transistor 311, an amplifier 312, a variable resistor 313, a current source 317, and resistors 318 and 319. Transistor 311 has a drain, a gate, and a source. Amplifier 312 has a non-inverting input, an inverting input connected to the source of transistor 311, and an output connected to the gate of transistor 311. Variable resistor 313 has a first terminal connected to the source of transistor 311, a second terminal connected to ground, and a control terminal connected to the true and complementary outputs of HF clock generator 304. Current source 317 has a first terminal connected to the source of transistor 311, and a second terminal connected to ground. Resistor 318 has a first terminal for receiving input voltage $V_{IN}$, and a second terminal connected to the non-inverting input of amplifier 312. Resistor 319 has a first terminal connected to a second terminal of resistor 318, and a second terminal connected to ground.

Variable resistor 313 includes an N-channel MOS transistor 314, a capacitor 315, and an N-channel MOS transistor 316. Transistor 314 has a drain connected to the source of transistor 311 and to the inverting input of amplifier 312, a gate connected to the second output of HF clock generator 304, and a source. Capacitor 315 has a first terminal connected to the source of transistor 314, and a second terminal connected to ground. Transistor 316 has a drain connected to the source of transistor 314, a gate connected to the first output of HF clock generator 304, and a source connected to ground.

Current mirror 320 includes P-channel MOS transistors 322 and 324 and a direct current (DC) filter 326. Transistor 322 has a source connected to $V_{CC}$, a gate, and a drain connected to the gate thereof and to the drain of transistor 311 and forming an input of current mirror 320. Transistor 324 has a source connected to $V_{CC}$, a gate, and a drain forming an output of current mirror 320 and providing signal $V_{RAMP}$. DC filter 326 has an input connected to the gate and drain of transistor 322, and an output connected to the gate of transistor 324.

Ramp capacitor 330 has a first terminal connected to the drain of transistor 324, and a second terminal connected to ground. Current source 332 has a first terminal connected to the drain of transistor 324 and to the first terminal of ramp capacitor 330, and a second terminal connected to ground. Transistor 340 has a drain connected to the first terminal of ramp capacitor 330, a gate connected to the output of narrow pulse generator 308, and a source connected to ground.

FIG. 3 also shows a timing diagram 350 of signals useful in understanding ramp generator 100. In FIG. 3, the horizontal axis represents time in μs, and the vertical axis represents the amplitude of respective signals in mV. Timing diagram 350 includes a first waveform 352 corresponding to signal $V_{RAMP}$, and a second waveform 354 showing the output of narrow pulse generator 308 that is provided to the gate of transistor 340.

Ramp generator 300 shows an example of the implementation of a variable resistor 313 and PWM clock generator 302. In the example of FIG. 3, the current mirror formed by the transistors 322 and 324 has a gain of one. As can be appreciated, the current mirror may also have a different gain depending on the application. PWM clock generator 302 includes HF clock generator 304 that generates a high frequency clock signal that is divided by a clock divider 306 to generate the PWM CLOCK signal. Clock divider 306 reduces the frequency of the high frequency clock signal by $N_1$ times. As a result, variable resistor 313 has a modulated frequency equal to $N_1$ times that of the PWM CLOCK signal. $N_1$ can be any integral number, but a larger number is preferred so that DC filter 326 can be smaller.

In the example of FIG. 3, variable resistor 313 is implemented as a switched capacitor including capacitor 315 and transistors 314 and 316. HF clock generator 304 outputs two high frequency clock signals including an HF clock signal and a complement of the HF clock signal, to alternately switch the first terminal of capacitor 315 between the first terminal of variable resistor 313 and ground. Because the current through variable resistor 313 is an alternating current (AC) signal, ramp generator 300 provides current sources 317 and 332 to add bias currents to the input and output sides, respectively, of current mirror 320. Current mirror 320 further includes DC filter 326 to allow current sources 317 and 332 to properly bias transistors 322 and 324.

In the example of FIG. 3, the resistance of variable resistor 313 ($R_5$) is given by:

$$R_5 = \frac{1}{CR1 * fS * N1} \quad \text{(EQ. 4)}$$

in which $C_{R1}$ is the capacitance of capacitor 315. Substituting $R_5$ of EQ. 4 for $R_3$ in EQ. 2 gives the peak voltage $V_{AMP}$ as:

$$V_{AMP} = \frac{VIN * TS * R2 * CR1 * fS * N1}{(R1 + R2)CRAMP} \quad \text{(EQ. 5)}$$

or:

$$V_{AMP} = \frac{VIN * R2 * CR1 * N1}{(R1 + R2)CRAMP} \quad \text{(EQ. 6)}$$

Assuming capacitors 315 and 330 are the same type of capacitors, the capacitor ratio $K_1$ is:

$$K1 = \frac{CR1}{CRAMP} \quad \text{(EQ. 7)}$$

in which $C_{R1}$ is the capacitance of capacitor 315. Assuming resistors 318 and 319 are the same type of resistance, and the resistor ratio $K_2$ is:

$$K2 = \frac{R2}{R1 + R2} \quad \text{(EQ. 8)}$$

then the peak voltage $V_{AMP}$ is then given by:

$$V_{AMP} = *K_1 * K_2 * N_1 \quad \text{(EQ. 9)}$$

From EQ. 9, it can be readily appreciated that in the example of FIG. 3, the amplitude of the ramp signal $V_{RAMP}$ is not affected by the frequency of the PWM clock signal. Also, the amplitude of the ramp signal $V_{RAMP}$ is not affected by the absolute values of the used capacitors and resistors. Therefore, the capacitor ratio $K_1$, the resistor ratio $K_2$, and the clock divide number $N_1$ may be selected to meet a wide range of frequency requirements. Because, generally speaking, the IC fabrication process is very good for resistor and capacitor matching, $K_1$ and $K_2$ are well maintained without needing further trimming, thereby reducing the cost of IC testing.

Figure 4:
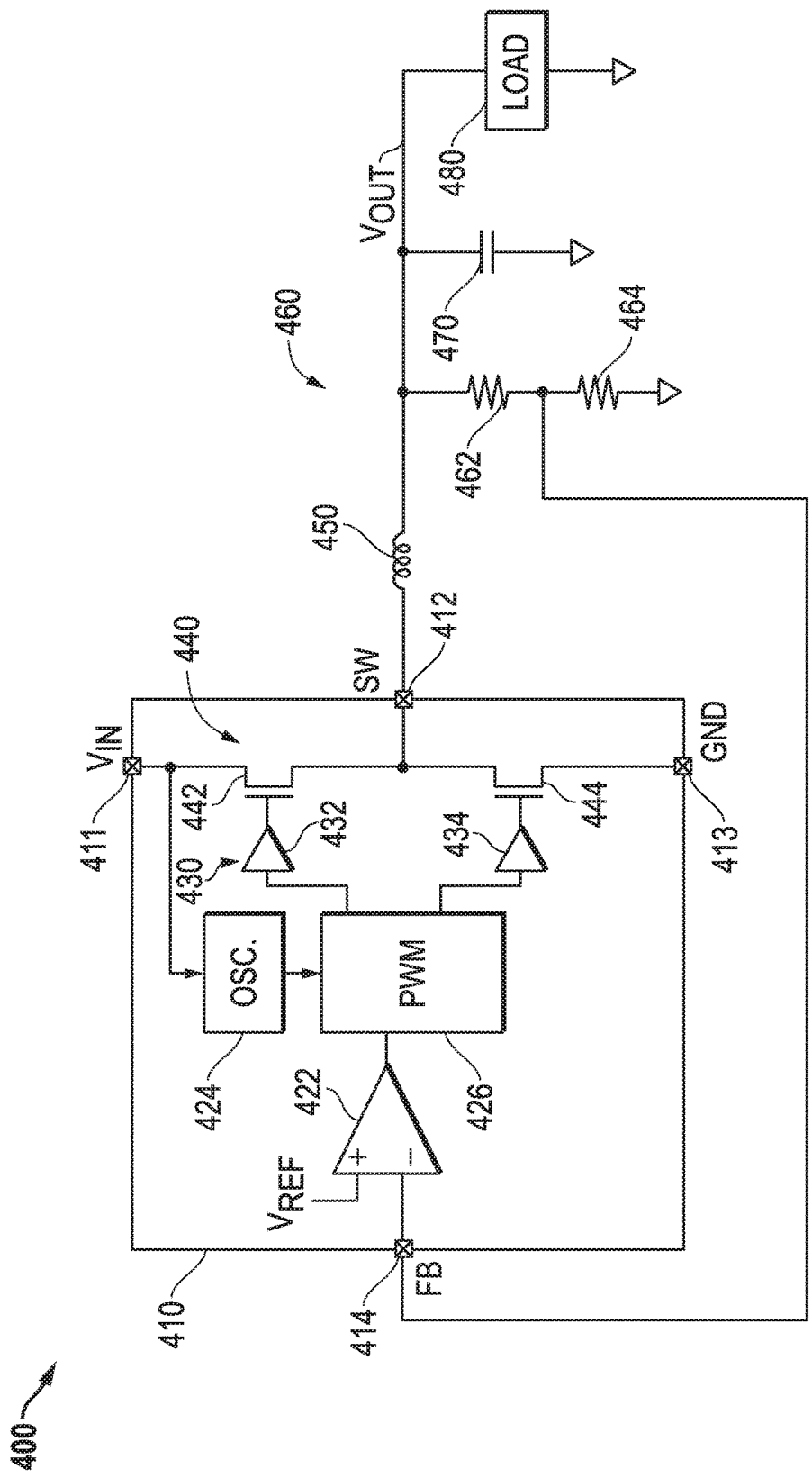
FIG. 4 shows a partial block and partial schematic diagram of a switch mode power supply in accordance with yet another embodiment of the present invention.

FIG. 4 shows a partial block and partial schematic diagram of a switch mode power supply 400 in accordance with yet another embodiment of the present invention. Switch mode power supply 400 is a voltage mode, DC-DC buck controller including generally PWM controller 410, an inductor 450, a resistor divider 460, an output capacitor 470, and a load 480. PWM controller 410 is an integrated circuit controller having a terminal 411 for receiving $V_{IN}$, a terminal 412 labeled "SW" for connection to an inductor, a terminal 413 labeled "GND", and a terminal 414 labeled "FB". Inductor 450 has a first terminal connected to terminal 412 of PWM controller 410, and a second terminal for providing $V_{OUT}$. Resistor divider 460 includes resistors 462 and 464. Resistor 462 has a first terminal connected to the second terminal of inductor 450, and a second terminal connected to terminal 414 of PWM controller 410 for providing a feedback signal thereto. Resistor 464 has a first terminal connected to the second terminal of resistor 462, and a second terminal connected to ground. Capacitor 470 has a first terminal connected to the second terminal of inductor 450, and a second terminal connected to ground. Load 480 has a first terminal connected to the second terminal of inductor 450, and a second terminal connected to ground.

PWM controller 410 includes an error amplifier 422, an oscillator 424, a PWM logic circuit 426, a driver stage 430, and an output stage 440. Error amplifier 422 has non-inverting input for receiving a reference voltage labeled "$V_{REF}$", an inverting input connected to terminal 414, an output. Oscillator 424 has an input connected to terminal 411, and an output and may be implemented by ramp generator 200 of FIG. 2 or ramp generator 300 of FIG. 3. PWM logic circuit 426 has a first input connected to the output of oscillator 424, a second input connected to the output of error amplifier 422, a first output for providing a high-side switch signal, and a second output for providing a low-side switch signal. Driver stage 430 includes drivers 432 and 434. Driver 432 has an input connected to the first output of PWM logic circuit 426, and an output. Driver 434 has an input connected to the second output of PWM logic circuit 426, and an output. Output stage 440 includes N-channel MOS transistors 442 and 444. Transistor 442 has a drain connected to terminal 411, a gate connected to the output of driver 432, and a source connected to terminal 412. Transistor 444 has a drain connected to terminal 412, a gate connected to the output of driver 434, and a source connected to terminal 413.

PWM controller 410 provides voltage-mode PWM control by developing an error signal by comparing a feedback signal received at terminal 414 to reference voltage $V_{REF}$. Switch mode power supply 400 generates the feedback signal as a fraction of output voltage $V_{OUT}$. Error amplifier 422 compares the FB signal to $V_{REF}$ and generates a signal proportional to the difference. In voltage mode control, there will also typically be a compensation network connected to the output terminal of error amplifier 422, but this detail is not shown in FIG. 4. PWM logic circuit 426 then generates the high-side and low-side switch signals by comparing the ramp signal generated by oscillator 424 to the compensated error signal. PWM logic circuit 426 makes the high-side switch active and the low-side switch inactive at the beginning of each oscillator cycle. PWM logic circuit 426 makes the high-side switch inactive and the low-side switch active when the oscillator ramp signal exceeds the compensated error signal. In some embodiments, oscillator 424 also provides a maximum duty cycle signal to PWM logic circuit 426 to limit the duty cycle to a certain maximum value.

Because switch mode power supply 400 is based on an oscillator 424 that is implemented using ramp generator 200 of FIG. 2 or ramp generator 300 of FIG. 3, it can be programmed for and operated in a wide variety of applications in which the switching frequency varies by as much as an order of magnitude or more, thus increasing its flexibility.

While specific embodiments of the present invention have been provided, it is to be understood that these embodiments are for illustration purposes and are not limiting. Many additional embodiments will be apparent to persons of ordinary skill in the art reading this disclosure.

The above-disclosed subject matter is to be considered illustrative, and not restrictive, and the appended claims are intended to cover all such modifications, enhancements, and other embodiments that fall within the true scope of the claims. For example while a switched capacitor is an especially efficient implementation of a variable resistor in terms of space and precision, the variable resistor can be implemented in different ways. The switching frequency can also be set by a variety of techniques, such as by using a resistor external to the chip, by a blowing one or more fuses, and the like. Moreover while the disclosed ramp generator is especially useful in a voltage-mode DC-DC converter, it can be used in a variety of other circuits such as other configurations of switched mode power supply controllers.

Thus, to the maximum extent allowed by law, the scope of the present invention is to be determined by the broadest permissible interpretation of the following claims and their equivalents, and shall not be restricted or limited by the foregoing detailed description.

What is claimed is:

1. A ramp generator, comprising:
   a current generator having an input for receiving a clock signal, and an output for providing a current proportional to a frequency of said clock signal, said current generator comprising:
   a first transistor having a first current electrode for providing said current, a second current electrode, and a control electrode;
   an amplifier having a non-inverting input for receiving a reference voltage, an inverting input coupled to said second current electrode of said first transistor, and an output coupled to said control electrode of said first transistor; and
   a variable resistor having a first terminal coupled to said second current electrode of said first transistor, a second terminal coupled to a first power supply voltage terminal, and a control terminal for receiving said clock signal,
   a current mirror having an input coupled to said first terminal of said first transistor, and an output; and
   a first capacitor having a first terminal coupled to said output of said current mirror and providing a ramp signal, and a second terminal coupled to said first power supply voltage terminal.

2. The ramp generator of claim 1, wherein said variable resistor comprises a switched capacitor resistor.

3. The ramp generator of claim 2, wherein said variable resistor comprises:
   a second transistor having a first current electrode coupled to said second current electrode of said first transistor, a control electrode for receiving a complement of said clock signal, and a second current electrode;
   a second capacitor having a first terminal coupled to said second current electrode of said second transistor, and a second terminal coupled to said first power supply voltage terminal; and
   a third transistor having a first current electrode coupled to said second current electrode of said second transistor, a control electrode for receiving said clock signal, and a second current electrode coupled to said first power supply voltage terminal.

4. The ramp generator of claim 3, further comprising:
   a clock circuit having a first output for providing said clock signal, a second output for providing said complement of said clock signal, and a third output for providing a divided clock signal; and
   a fourth transistor having a first current electrode coupled to said first terminal of said first capacitor, a control electrode coupled to said third output of said clock circuit, and a second current electrode coupled to said first power supply voltage terminal.

5. The ramp generator of claim 4, further comprising:
   a narrow pulse generator coupled between said third output of said clock circuit and said control electrode of said fourth transistor and responsive to said divided clock signal for providing a narrow clock pulse to said control electrode of said fourth transistor wherein said narrow clock pulse has a rising edge aligned with a rising edge of said divided clock signal, and an active period less than an active period of said divided clock signal.

6. The ramp generator of claim 5, further comprising:
a first current source having a first terminal coupled to said second current electrode of said first transistor, and a second terminal coupled to said first power supply voltage terminal; and
a second current source having a first terminal coupled to said first terminal of said first capacitor, and a second terminal coupled to said first power supply voltage terminal.

7. The ramp generator of claim 1, further comprising:
a first resistor having a first terminal for receiving an input voltage, and a second terminal coupled to said non-inverting input of said amplifier for providing said reference voltage; and
a second resistor having a first terminal coupled to said second terminal of said first resistor, and a second terminal coupled to said first power supply voltage terminal.

8. The ramp generator of claim 1, wherein said current mirror comprises:
a fifth transistor having a first current electrode coupled to a second power supply voltage terminal, a control electrode, and a second current electrode coupled to said control electrode thereof and to said first current electrode of said first transistor; and
a sixth transistor having a first current electrode coupled to said second power supply voltage terminal, a control electrode coupled to said second current electrode of said fifth transistor, and a second current electrode coupled to said first terminal of said first capacitor.

9. The ramp generator of claim 8, wherein said second current electrode of said fifth transistor is coupled to said control electrode of said sixth transistor through a direct current (DC) filter.

10. A method comprising:
setting a value of a variable resistor according to a frequency of a first clock signal;
generating an input current according to said value of said variable resistor;
mirroring said input current to form a ramp current proportional to said input current; and
alternately charging a first capacitor using said ramp current and discharging said first capacitor in synchronism with a second clock signal; and
forming a ramp signal from a voltage on said first capacitor.

11. The method of claim 10 wherein said setting said value of said variable resistor comprises:
switching a first terminal of a second capacitor to a first terminal of said variable resistor in response to a complement of said first clock signal; and
switching said first terminal of said second capacitor to a power supply voltage terminal in response to said first clock signal.

12. The method of claim 11, further comprising:
discharging said first capacitor in synchronism with a divided clock signal formed by dividing said first clock signal.

13. The method of claim 10 wherein said generating said input current comprises:
providing said input current from a first current electrode of a first transistor; and
biasing a control electrode of said first transistor according to a difference between a reference voltage and a voltage on a second current electrode of said first transistor.

14. The method of claim 13, further comprising:
forming said reference voltage as a proportion of an input voltage.

15. The method of claim 10, further comprising:
using said ramp signal to form an output voltage in a switch mode power supply.

* * * * *